United States Patent

Harada

[11] Patent Number: 5,949,299
[45] Date of Patent: Sep. 7, 1999

[54] MULTILAYERED BALANCE-TO-UNBALANCE SIGNAL TRANSFORMER

[75] Inventor: Nobumi Harada, Chiba, Japan

[73] Assignee: TDK Corporation, Tokyo, Japan

[21] Appl. No.: 09/002,919

[22] Filed: Jan. 5, 1998

[30] Foreign Application Priority Data

Jan. 7, 1997 [JP] Japan ................................. 9-000733

[51] Int. Cl.$^6$ ................ H03H 7/42; H01P 5/10
[52] U.S. Cl. ................ 333/25; 333/26; 333/185
[58] Field of Search .................. 333/25, 26, 129, 333/131, 132, 134, 185

[56] References Cited

U.S. PATENT DOCUMENTS

| | | | |
|---|---|---|---|
| 5,023,576 | 6/1991 | Staudinger et al. | 333/25 X |
| 5,157,576 | 10/1992 | Takaya et al. | 333/185 X |
| 5,382,925 | 1/1995 | Hayashi et al. | 333/112 |
| 5,497,137 | 3/1996 | Fujiki | 336/200 |
| 5,602,517 | 2/1997 | Kaneko et al. | 333/185 |
| 5,777,533 | 7/1998 | Kato et al. | 333/185 |
| 5,783,976 | 7/1998 | Furutani et al. | 333/134 |

FOREIGN PATENT DOCUMENTS

| | | |
|---|---|---|
| 42 03 961 | 8/1992 | Germany . |
| 3-153011 | 7/1991 | Japan . |
| 5-167374 | 7/1993 | Japan . |
| 6-163321 | 6/1994 | Japan . |

OTHER PUBLICATIONS

Patent Abstracts of Japan, vol. 013, No. 280 (E–779), Jun. 27, 1989, JP 01–065904, Mar. 13,1989.

Patent Abstracts of Japan, vol. 015, No. 383(E–1116), Sep. 27, 1991, JP 03–153011, Jul. 1, 1991.

*Primary Examiner*—Paul Gensler
*Attorney, Agent, or Firm*—Oblon, Spivak McClelland, Maier & Neustadt, P.C.

[57] ABSTRACT

A multilayered balun transformer in which not only loss can be suppressed but also phase difference or level difference between balanced signal terminals can be suppressed and which become easy to design. In the multilayered balun signal transformer, a coil 4 and a capacitor C1 are formed in a dielectric by a multilayered structure to thereby form a high-pass filter 6. A low-pass filter 9 is formed from another combination of a coil 7 and a capacitor C2. The high-pass filter 6 and the low-pass filter 9 are arranged lengthwise in the direction of multilayer so that the capacitors C1 and C2 are present on extensions of magnetic flux generated in the inside of the coils 4 and 7 respectively.

2 Claims, 5 Drawing Sheets

AMPLITUDE IMBALANCE

PHASE IMBALANCE

MULTILAYERED BALANCE-TO-UNBALANCE SIGNAL TRANSFORMER

BACKGROUND OF THE INVENTION

The present invention relates to a multilayered balun (balance-to-unbalance) signal transformer which is used in a mobile communication apparatus, or the like.

A balun (balance-to-unbalance) transformer has a function of converting an unbalanced signal relative to the ground into balanced signals on a pair of lines or converting balanced signals into an unbalanced signal. The balun transformers of this type are used in transmitting circuits and receiving circuits of mobile communication apparatuses such as portable telephones, car telephones, etc.

FIG. 5A shows an example of use of such a balun transformer and an example of a transmitting circuit in a portable telephone. A voice modulation signal 30 and an oscillation signal of a voltage-controlled oscillator 31 are mixed with each other by a mixer 32. The output of the mixer 32 is made to pass through a band-pass filter 33. An unbalanced signal which is the output of the band-pass filter 33 is converted into balanced signals by the balun transformer 34, so that the balanced signals are supplied to a power amplifier 35 which is a balanced signal input-unbalanced signal output type. The reference numeral 36 designates a coupler for detecting the level of a transmission signal; 37, an AGC circuit for controlling the gain of the power amplifier 35 on the basis of the level of the transmission signal detected by the coupler 36; 38, a low-pass filter; and 39, a duplexer for separating the signal into a transmission signal and a receiving signal by frequencies. Such a balun transformer 34 may be provided between the mixer 32 and the band-pass filter 33. If the balun transformer 34 is used to provide balanced signals to be used in the power amplifier 35, there arises an advantage that the level of noise can be reduced compared with the case where an unbalanced signal is used.

As the aforementioned balun transformer 34, there is heretofore used a configuration as shown in FIG. 5B in which two transformers 40 and 41 are provided between a pair of balanced signal terminals 1a and 1b and an unbalanced signal terminal 2, a configuration as shown in FIG. 5C in which a transformer 42 is provided between a pair of balanced signal terminals 1a and 1b and an unbalanced signal terminal 2 and in which an intermediate tap of a coil 43 between the balanced signal terminals is connected to the ground, or the like. Although the aforementioned balun transformer has been conventionally achieved by a wire-wound type transformer, a configuration in which a balun transformer is formed from a multilayered structure containing an electrical conductor pattern formed between electrically insulating layers to make coils contained in a chip to thereby form a transmission line type transforming circuit has been described, for example, in JP-A-3-153011, etc.

The aforementioned conventional balun transformer formed from a multilayered structure is excellent both in reduction of size and in mass production. In order to achieve better characteristic in the transmission line type transformer, however, the degree of coupling between coils is necessary to be enhanced. It is very difficult that such high coupling is achieved by a multilayered structure. Better characteristic than that of the wire-wound type balun transformer has been not achieved. That is, in the case of a multilayered structure, a large loss occurs to bring a problem that phase difference or level difference cannot be suppressed when the balanced signal terminal side is used as the output terminal side. Further, when the winding ratio and inductance are to be set in the case where coils constituting the transformers 40 and 41 shown in FIG. 5B or the transformer 42 shown in FIG. 5C are contained in a multilayered structure, it is difficult to design the winding ratio, inductance value, etc.

SUMMARY OF THE INVENTION

The present invention is based on the aforementioned problems and has as its object the provision of a multilayered balance-to-unbalance (balun) signal transformer which is advantageous both in reduction of size and in mass production and in which the loss is so small that the phase difference or level difference between-balanced signal terminals can be suppressed to be designed easily.

In order to achieve the above object, according to the present invention, a multilayered balun signal transformer comprises a dielectric block having a multilayered structure; a high-pass filter including a first coil and a first capacitor, the first capacitor and first coil being arranged lengthwise in a direction of the layers of the dielectric block so that the capacitor is located on an extension of magnetic flux generated inside of the first coil; and a low pass filter a including a second coil and a second capacitor, the second capacitor and second coil being arranged lengthwise in the direction of layers of the dielectric block so that the capacitor is located on an extension of magnetic flux generated inside of the first coil.

Further, according to the present invention, a multilayered balun signal transformer as mentioned above further comprises a first balanced signal terminal formed on a side surface of the multilayered structure, to which one end of said first coil and one end of said first capacitor are connected; a first ground terminal formed on a side surface of said multilayered structure, to which the other end of said first coil is connected; an unbalanced signal terminal formed on a side surface of the multilayered structure, to which the other end of said first capacitor and one end of said second coil are connected; a second balanced signal terminal formed on a side surface of said multilayered structure, to which the other end of said second coil and one end of said second capacitor are connected; and a second ground terminal formed on a side surface of said multilayered structure, to which the other end of said second capacitor is connected.

Further, according to the present invention, in the multilayered balun signal transformer, the respective capacitors in the high-pass filter and the low-pass filter are arranged side by side, and the respective coils in the high-pass filter and the low-pass filter are arranged side by side; and the capacitor-forming side surface is used as a mounting surface.

According to the present invention, when an unbalanced signal terminal is disposed in the input side and balanced signal terminals are disposed in the output side, a signal to be transmitted advances by 90 degrees in the capacitor of the high-pass filter and lags by 90 degrees in the coil of the low-pass filter. Accordingly, balanced signals having a phase difference of 180 degrees are obtained in the balanced signal terminals in pair. Contrariwise, when balanced signal terminals are disposed in the input side and an unbalanced signal is disposed in the output side, a signal passing through the capacitor of the high-pass filter advances by 90 degrees and a signal passing through the coil of the low-pass filter lags by 90 degrees. Accordingly, an in-phase synthesized signal is obtained between the unbalanced signal terminal and the ground.

Furthermore, the capacitor side is used as the mounting surface side. Accordingly, the capacitors are interposed between the coils and mounting patterns of a substrate on which the balun transformer is to be mounted, so as to play the role of a shield. Accordingly, the influence of the mounting pattern on the operation of the transformer can be reduced.

DETAILED DESCRIPTION OF THE PREFERRED EMBODIMENTS

Figure 1A:
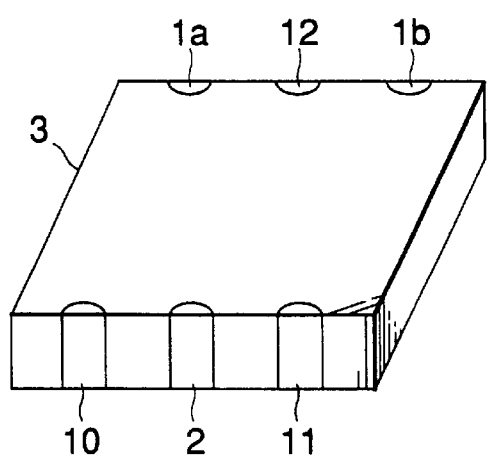
FIG. 1A is a perspective view showing an embodiment of a multilayered balun signal transformer according to the present invention.
Figure 1B:
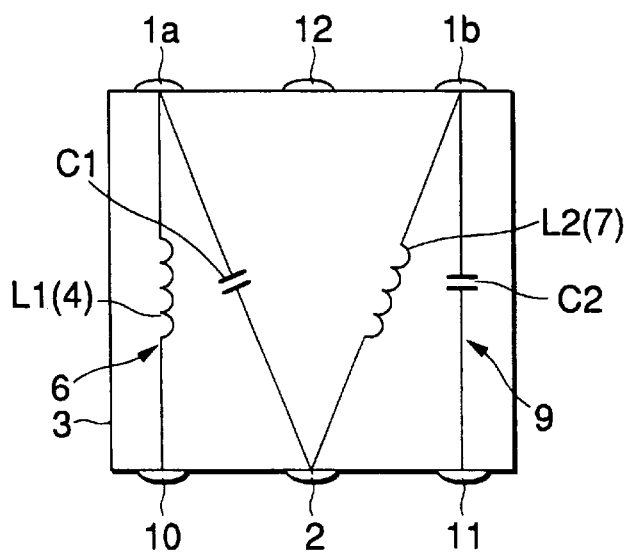
FIG. 1B is a configuration view of the multilayered balun signal transformer.
Figure 1C:
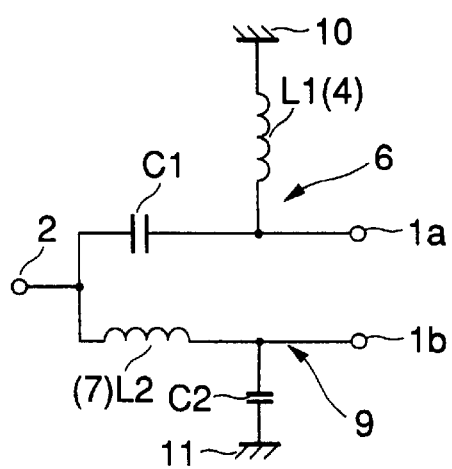
FIG. 1C is a diagram of a circuit equivalent to the multilayered balun signal transformer.
Figure 1D:
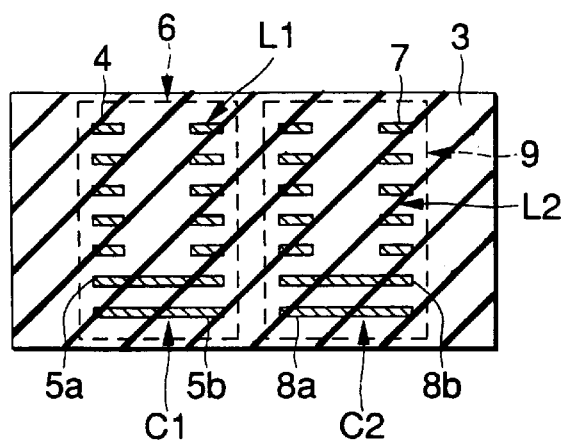
FIG. 1D is a sectional view of the multilayered balun signal transformer.
Figure 2A:
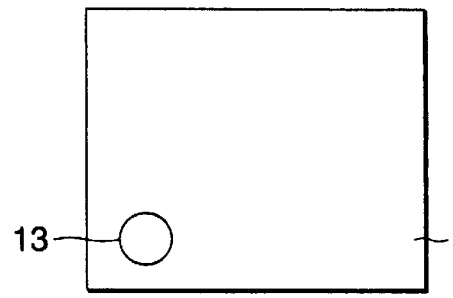
FIGS. 2A to 2H are a series of views showing the multilayered structure of the multilayered balun signal transformer in the embodiment depicted in FIG. 1.
Figure 2B:
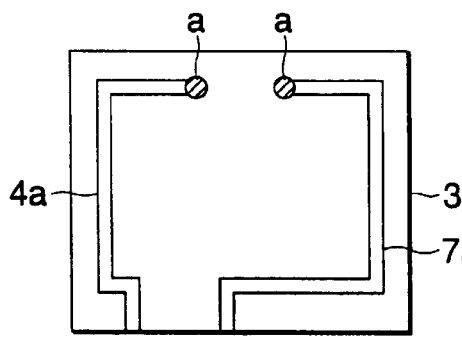
Figure 2C:
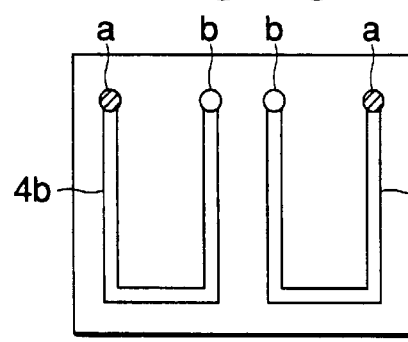
Figure 2D:
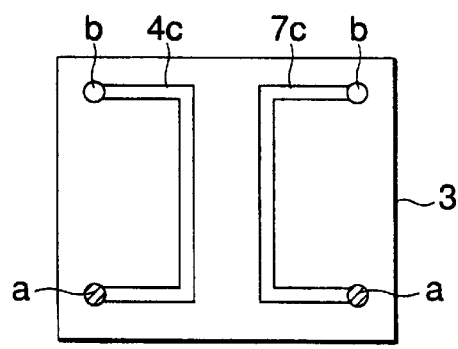
Figure 2E:
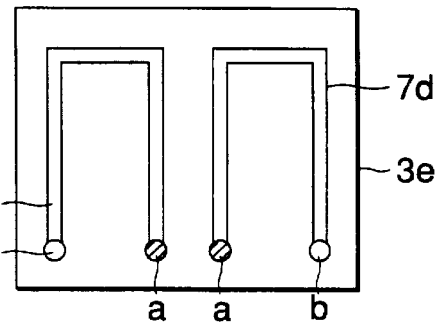
Figure 2F:
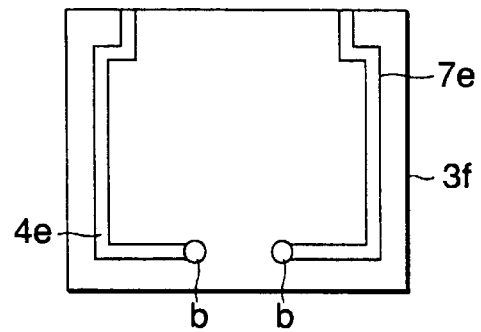
Figure 2G:
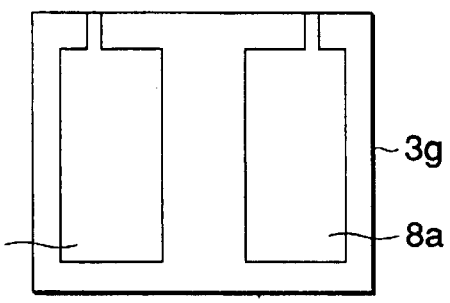
Figure 2H:
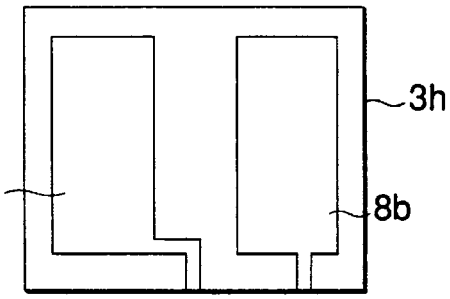

An embodiment of the present invention will be described below with reference to the drawings. FIGS. 1A to 1D and FIG. 2 show an embodiment of a multilayered balance-to-unbalance (balun) signal transformer according to the present invention. FIG. 1A is a perspective view of the multilayered balun signal transformer; FIG. 1B is a configuration view of the multilayered balun signal transformer; FIG. 1C is a diagram of a circuit equivalent to the multilayered balun signal transformer; FIG. 1D is a sectional view of the multilayered balun signal transformer; and FIG. 2 is a series of views showing a multilayered structure of the multilayered balun signal transformer.

As shown in FIG. 1D, in the multilayered balun signal transformer of this embodiment, an inductor L1 constituted by a coil 4 formed of an electrical conductor pattern of a metal such as silver, nickel, copper, or the like, and a capacitor C1 constituted by capacitor electrodes 5a and 5b formed of an electrical conductor of the same material as described above are formed in a multilayered body 3 of low dielectric constant constituted by a dielectric of ceramics such as alumina, or the like, or of a mixture of glass and ceramics to thereby form a high-pass filter 6. Further, a low-pass filter 9 is formed from another combination of an inductor L2 constituted by a coil 7 formed of the same material as the coil 4 and a capacitor C2 constituted by capacitor electrodes 8a and 8b formed of the same material as the capacitor electrodes 5a and 5b so that the low-pass filter 9 and the high-pass filter 6 are disposed side by side. In this embodiment, the capacitance values of the capacities C1 and C2 and the inductance values of the inductors L1 and L2 are selected to 2 pF and 18 nH respectively equally.

Not only the capacitor C1 and the coil 4 in the high-pass filter 6 are arranged lengthwise in the direction of the multilayered structure so that the capacitor C1 is present on an extension of magnetic flux generated in the inside of the coil 4 by means of the coil 4, but also the capacitor C2 and the coil 7 in the low-pass filter 9 are arranged lengthwise in the direction of the multilayered structure in the same manner as described above.

As shown in FIGS. 1A and 1B, balanced signal terminals 1a and 1b, an unbalanced signal terminal 2, ground terminals 10 and 11 and a dummy terminal 12 are provided on the side surfaces of the multilayered structure 3. The dummy terminal 12 is soldered to a ground pattern, or the like, of a substrate in order to increase the strength of mounting when the multilayered balun signal transformer is mounted onto the substrate by soldering. The dummy terminal 12 is not connected to any constituent element of the high-pass filter 6 and the low-pass filter 9.

As shown in FIGS. 1B and 1C, one end of the coil 4 constituting the inductor L1 of the high-pass filter 6 and one end of the capacitor C1 of the high-pass filter 6 are connected to the balanced signal terminal 1a on a side surface of the multilayered structure and the other end of the coil 4 in the high-pass filter 6 is connected to the ground terminal 10 on a side surface of the multilayered structure.

Further, the other end of the capacitor C1 in the high-pass filter 6 and one end of the coil 7 in the low-pass filter 9 are connected to the unbalanced signal terminal 2 provided on a side surface of the multilayered structure 3. Further, the other end of the coil 7 of the low-pass filter 9 and one end of the capacitor C2 of the low-pass filter 6 are connected to the other balanced signal terminal 1b on a side surface of the multilayered structure 3. Further, the other end of the capacitor C2 of the low-pass filter 9 is connected to the ground terminal 11 on a side surface of the multilayered structure 3.

When the multilayered balun signal transformer of this embodiment is to be produced by a sheet method, coil patterns 4a to 4e and 7a to 7e constituting the coils 4 and 7 respectively and electrical conductor patterns of the capacitor electrodes 5a, 5b, 8a and 8b are formed on dielectric sheets 3a to 3h as shown in FIGS. 2A to 2H. Further, through-holes a are provided in respective end portions a of the coil patterns 4a to 4e and 7a to 7e so that the through-holes a are connected to corresponding end portions b of the coil patterns on an adjacent sheet in the lower side. Further, these sheets are laminated, solderlessly bonded to one another, sintered and then cut or cut and then sintered. Then, the aforementioned terminals 1a, 1b, 2 and 10 to 12 are provided on side surfaces of each cut chip to thereby produce the multilayered balun signal transformer. As occasion demands, dielectric sheets with no electrical conductor pattern formed thereon or dielectric sheets having only through-holes provided therein are interposed between the respective layers shown in FIGS. 2A to 2H or on the rear surfaces thereof before lamination. Incidentally, the reference numeral 13 in FIG. 2A designates a mark which is provided near one corner of a multilayer chip in order to indicate the direction of the multilayer chip and which is formed by printing of an electrical conductor. The multilayered balun signal transformer according to the present invention can be also produced by a printing method.

Figure 3A:
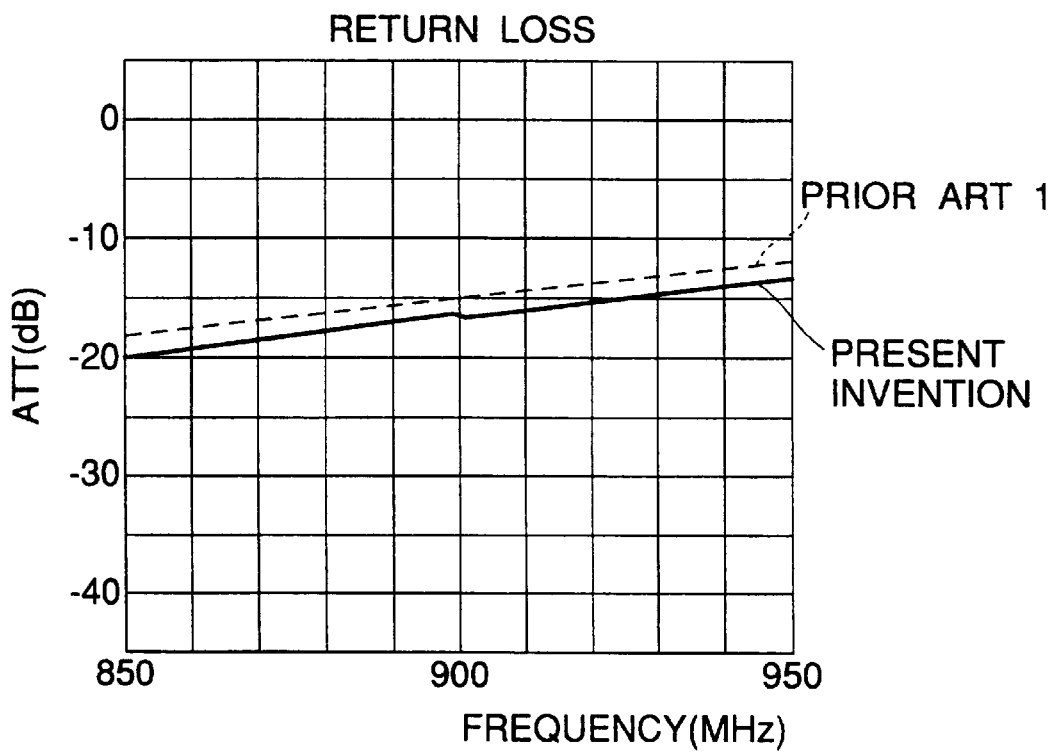
FIG. 3A is a graph of return loss in comparison between the present invention and the prior art.
Figure 3B:
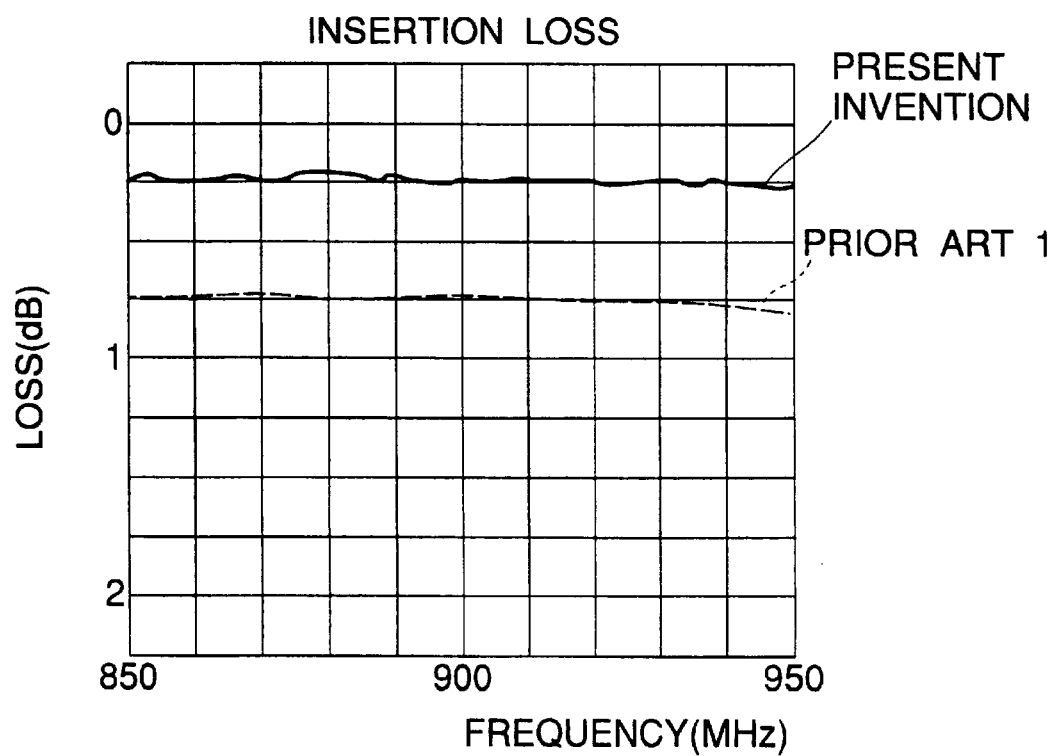
FIG. 3B is a graph of insertion loss in comparison between the present invention and the prior art.
Figure 5A:
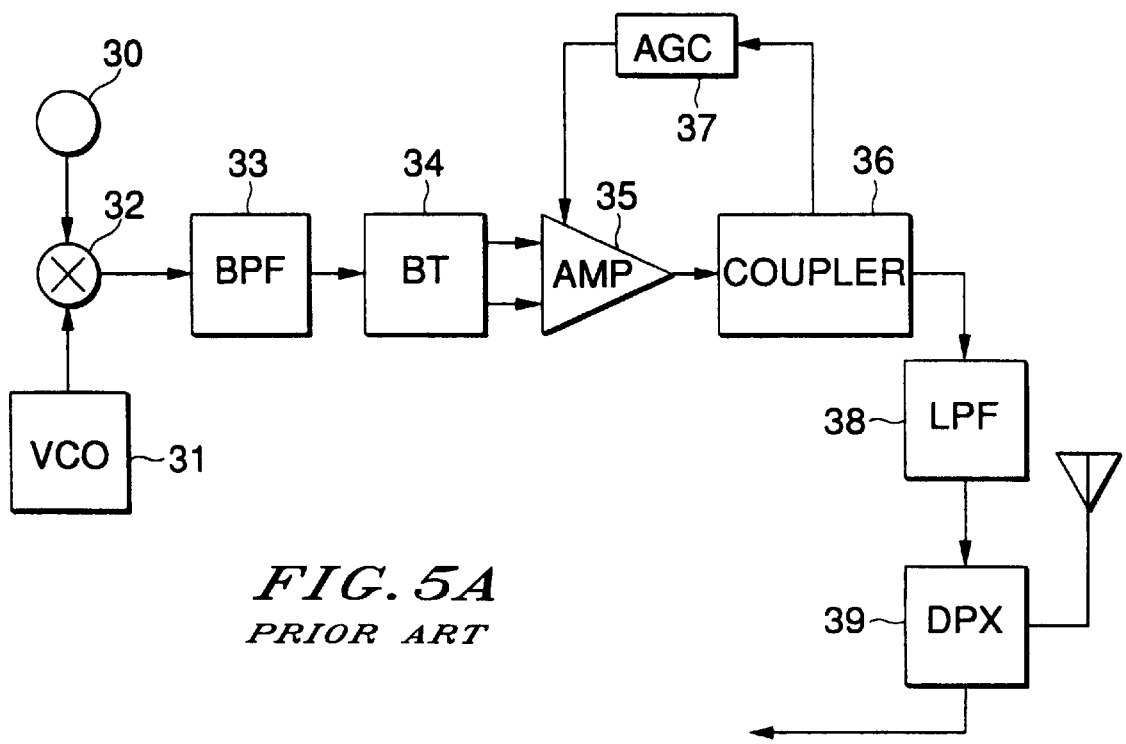
FIG. 5A is a block diagram showing a transmitting circuit of a portable telephone as an example of use of the balun transformer.
Figure 5B:
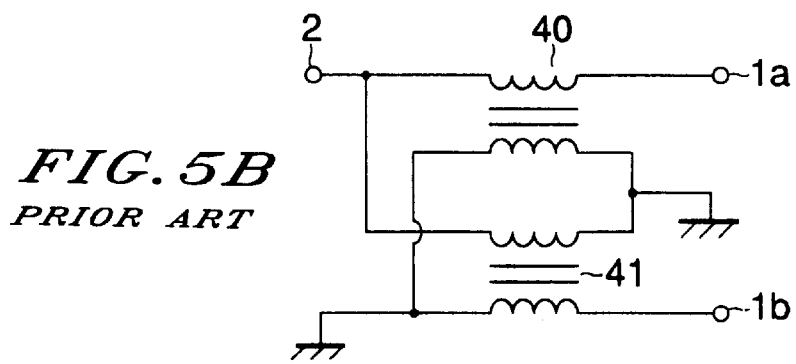
FIGS. 5B and 5C are circuit diagrams of conventional balun transformers.
Figure 5C:
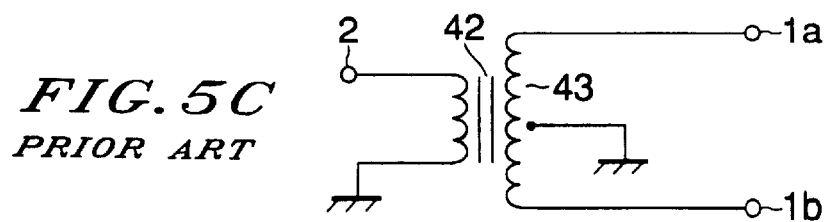

FIGS. 3A and 3B are graphs showing return loss (loss due to reflection caused by impedance mismatching) and insertion loss in a range of from 850 MHz to 950 MHz in comparison between the case where the prior art 1 as shown in FIG. 5B is achieved by a multilayered balun signal transformer having a size of 3.2 mm×2.5 mm×1.5 mm, and the case where the multilayered balun signal transformer of the present invention is achieved by the multilayered structure. As is obvious from these graphs, the return loss in the case according to the present invention is reduced compared with the prior art 1 and the insertion loss in the case according to the present invention is also greatly reduced to a value of about 0.2 to 0.3 dB compared with 0.7 to 0.8 dB in the prior art 1 (which is the same as the prior art 2 as shown in FIG. 5C).

Figure 4A:
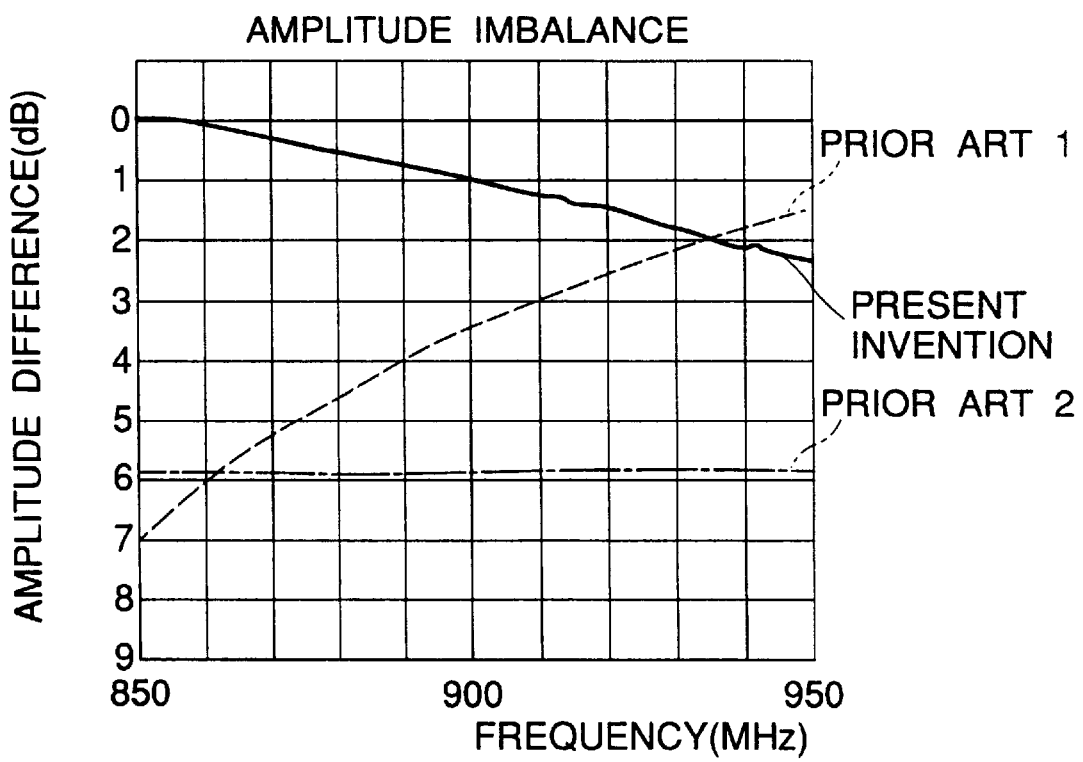
FIG. 4A is a graph of amplitude imbalance in comparison between the present invention and the prior art.
Figure 4B:
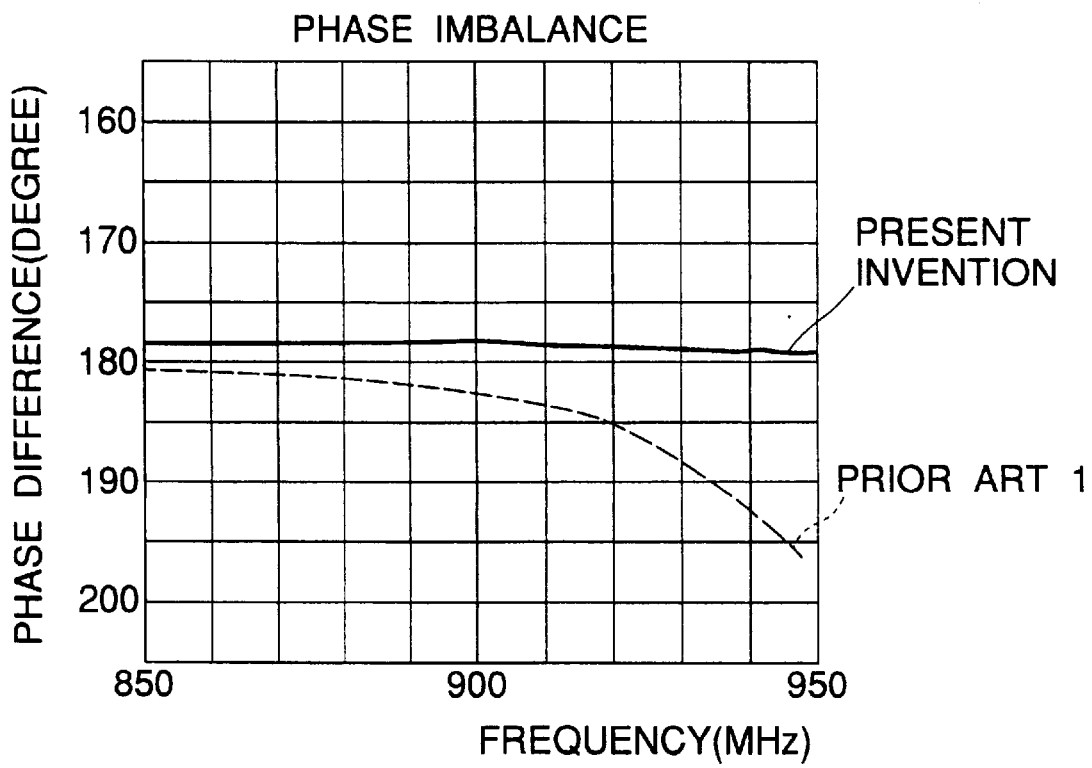
FIG. 4B is a graph of phase imbalance in comparison between the present invention and the prior art.

Further, FIGS. 4A and 4B are graphs showing output level difference (amplification factor balance) and phase difference (phase balance) between balanced signal terminals 1a and 1b disposed in the output side in the aforementioned frequency range in comparison with the prior art. In a range to be used, both amplitude difference and phase difference are reduced greatly compared with the prior arts.

Further, because the multilayered balun signal transformer according to the present invention is formed by using concentrated constant circuits of LC and because the high-pass filter and the low-pass filter are arranged side by side so as not to interfere with each other, characteristic as designed can be obtained easily. Accordingly, it is easy to design the multilayered balun signal transformer. Furthermore, because the design is easy, the frequency range and impedance can be changed easily.

Further, in the case where the high-pass filter and the low-pass filter are to be arranged side by side, the capacitor C2 may be arranged side by side with the coil 4 of the high-pass filter 6 and the capacitor Cl may be arranged side by side with the coil 7 of the low-pass filter 9. When the capacitors C1 and C2 of the filters 6 and 9 are arranged side by side so as to be used-as the mounting surface as shown in the aforementioned embodiment, the capacitors are interposed between a pattern on the mounting surface of a substrate and the coils 4 and 7 so that the influence of the pattern of the mounting surface on the operation of the transformer can be reduced.

According to the present invention, the respective coils and capacitors of the high-pass filter and the low-pass filter are arranged lengthwise side by side in the direction of multilayered structure. Accordingly, the degree of magnetic flux which is generated in the coil of one filter so as to pass through the other filter is reduced so that the interference between the filters is reduced. Accordingly, characteristic of L (inductor) and C (capacitor) is used effectively as it is, so that designing becomes easy. Further, because there is reduced interference between the filters, a multilayered balun signal transformer with low insertion loss, with narrow tolerance of small phase difference and with small level difference between two balanced signal terminals can be provided.

Furthermore, the capacitors of the filters are arranged side by side so that the capacitor-forming surface is provided as a mounting surface. Accordingly, the influence of the mounting pattern of a substrate for mounting the balun transformer on the operation of the balun transformer can be reduced.

What is claimed is:

1. A multilayered balun signal transformer comprising:

a dielectric block having a multilayered structure;

a high-pass filter including a first coil and a first capacitor, said first capacitor and first coil being arranged lengthwise in a direction of multilayer of the dielectric block so that said capacitor is located on an extension of magnetic flux generated inside of said first coil; and a low-pass filter and including a second coil and a second capacitor, said second capacitor and second coil being arranged lengthwise in the direction of multilayer of the dielectric block so that said capacitor is located on an extension of magnetic flux generated inside of said first coil;

a first balanced signal terminal formed on a side surface of the multilayered structure, to which one end of said first coil and one end of said first capacitor are connected;

a first ground terminal formed on a side surface of said multilayered structure, to which the other end of said first coil is connected;

an unbalanced signal terminal formed on a side surface of said multilayered structure, to which the other end of said first capacitor and one end of said second coil are connected;

a second balanced signal terminal formed on a side surface of said multilayered structure, to which the other end of said second coil and one end of said second capacitor are connected; and a second ground terminal formed on a side surface of said multilayered structure, to which the other end of said second capacitor is connected.

2. A multilayered balun signal transformer as claimed in claim 1, wherein said first and second capacitors in said high-pass filter and said low-pass filter are respectively arranged side by side and, said first and second coils in said high-pass filter and said low-pass filter are also respectively arranged side by side; and a surface of a capacitor-forming side is used as a mounting surface.

* * * * *